United States Patent
Liu (10) Patent No.: US 12,046,552 B2
(45) Date of Patent: Jul. 23, 2024

(54) ANTI-FUSE UNIT AND ANTI-FUSE ARRAY

(71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 472 days.

(21) Appl. No.: 17/386,484

(22) Filed: Jul. 27, 2021

(65) Prior Publication Data

US 2021/0358845 A1    Nov. 18, 2021

Related U.S. Application Data

(63) Continuation of application No. PCT/CN2021/080338, filed on Mar. 12, 2021.

(30) Foreign Application Priority Data

Apr. 8, 2020    (CN) .......................... 202010268402.5

(51) Int. Cl.
| | | |
|---|---|---|
| *H01L 23/525* | (2006.01) | |
| *G11C 17/16* | (2006.01) | |
| *G11C 17/18* | (2006.01) | |
| *H10B 20/20* | (2023.01) | |

(52) U.S. Cl.
CPC .......... *H01L 23/5252* (2013.01); *G11C 17/16* (2013.01); *G11C 17/18* (2013.01); *H10B 20/20* (2023.02)

(58) Field of Classification Search
CPC ..... H01L 23/5252; G11C 17/16; G11C 17/18; H10B 20/20; H10B 12/30
See application file for complete search history.

(56) References Cited

U.S. PATENT DOCUMENTS

| | | |
|---|---|---|
| 6,130,469 A | 10/2000 | Bracchitta |
| 6,956,258 B2 | 10/2005 | Peng |
| 10,177,924 B1 | 1/2019 | Chen et al. |

(Continued)

FOREIGN PATENT DOCUMENTS

| | | |
|---|---|---|
| CN | 104103624 A | 10/2014 |
| CN | 104425513 A | 3/2015 |
| CN | 109493908 A | 3/2019 |

OTHER PUBLICATIONS

International Search Report in the international application No. PCT/CN2021/080338, mailed on Jun. 22, 2021, 2 pgs.

*Primary Examiner* — Yasser A Abdelaziez
(74) *Attorney, Agent, or Firm* — Kilpatrick Townsend & Stockton LLP (57) ABSTRACT

An anti-fuse unit includes: an anti-fuse device; a first selection transistor electrically connected with the anti-fuse device; and a second selection transistor electrically connected with the first selection transistor. Each of the anti-fuse device, the first selection transistor and the second selection transistor is provided with a gate oxide layer and a gate conductive layer, the gate oxide layer of the anti-fuse device, the gate oxide layer of the first selection transistor and the gate oxide layer of the second selection transistor have a same thickness, and the gate conductive layer of the anti-fuse device, the gate conductive layer of the first selection transistor and the gate conductive layer of the second selection transistor have a same thickness.

15 Claims, 6 Drawing Sheets

(56) References Cited

U.S. PATENT DOCUMENTS

| | | |
|---|---|---|
| 10,361,212 B2 | 7/2019 | Son |
| 10,649,735 B2 | 5/2020 | Chen et al. |
| 10,664,239 B2 | 5/2020 | Chen et al. |
| 10,691,414 B2 | 6/2020 | Wu et al. |
| 10,868,021 B2 | 12/2020 | Son |
| 2008/0002504 A1* | 1/2008 | Nakano ................. G11C 17/18 |
| | | 257/E23.149 |
| 2015/0062998 A1* | 3/2015 | Nam ...................... H10B 20/20 |
| | | 365/96 |
| 2017/0053925 A1* | 2/2017 | Wong ............... H01L 23/53271 |
| 2018/0204843 A1 | 7/2018 | Son |
| 2019/0079732 A1 | 3/2019 | Wu et al. |
| 2019/0080778 A1 | 3/2019 | Chen et al. |
| 2019/0081804 A1 | 3/2019 | Chen et al. |
| 2019/0221572 A1 | 7/2019 | Son |
| 2022/0246225 A1* | 8/2022 | Chang ................. G11C 11/4094 |

* cited by examiner

FIG. 6

ANTI-FUSE UNIT AND ANTI-FUSE ARRAY

CROSS-REFERENCE TO RELATED APPLICATIONS

This application is a continuation application of International Patent Application No. PCT/CN2021/080338, filed on Mar. 12, 2021, and entitled "anti-fuse unit and anti-fuse array", which claims priority to Chinese patent application No. 202010268402.5, filed on Apr. 8, 2020, and entitled "anti-fuse unit and anti-fuse array". The contents of International Patent Application No. PCT/CN2021/080338 and Chinese patent application No. 202010268402.5 are hereby incorporated by reference in their entireties.

TECHNICAL FIELD

The disclosure relates to an anti-fuse unit and an anti-fuse array.

BACKGROUND

A Dynamic Random Access Memory (DRAM) chip usually has redundant memory cells, and these redundant memory cells can replace defective memory cells when the DRAM chip has the defective memory cells to achieve the purpose of repairing the DRAM. When the DRAM chip is repaired, one time program (OTP) devices, such as anti-fuse devices, are used.

SUMMARY

According to a plurality of embodiments, a first aspect of the disclosure provides an anti-fuse unit, including:
an anti-fuse device;
a first selection transistor electrically connected with the anti-fuse device; and
a second selection transistor electrically connected with the first selection transistor,
each of the anti-fuse device, the first selection transistor and the second selection transistor is provided with a gate oxide layer and a gate conductive layer, the gate oxide layer of the anti-fuse device, the gate oxide layer of the first selection transistor and the gate oxide layer of the second selection transistor have a same thickness, and the gate conductive layer of the anti-fuse device, the gate conductive layer of the first selection transistor and the gate conductive layer of the second selection transistor have a same thickness.

According to a plurality of embodiments, a second aspect of the disclosure provides an anti-fuse array, including a plurality of anti-fuse units as described above. The plurality of anti-fuse units are arranged in M rows and N columns, and the M and N are positive even numbers.

Details of one or more embodiments of the present disclosure will be proposed in the following accompanying drawings and descriptions. Other features and advantages of the present disclosure will become apparent from the specification, the accompanying drawings and the claims.

BRIEF DESCRIPTION OF THE DRAWINGS

To describe the technical solutions in the embodiments of the present disclosure more clearly, the following briefly introduces the accompanying drawings required in the embodiments. Apparently, the accompanying drawings in the following description show only some embodiments of the disclosure, and those of ordinary skill in the art may derive other drawings from these accompanying drawings without creative efforts.

LIST OF REFERENCE NUMERALS

10. anti-fuse device; 101. gate oxide layer; 102. gate conductive layer; 11. first selection transistor; 111. gate oxide layer; 112. gate conductive layer; 12. second selection transistor; 121. gate oxide layer; 122. gate conductive layer; 13. substrate; 14. first heavily doped region; 15. second heavily doped region; 16. third heavily doped region; 17. anti-fuse injection region.

DETAILED DESCRIPTION

In the related art, an anti-fuse unit includes an anti-fuse device and a selection transistor. During programming, the anti-fuse device requires a higher programming voltage. When the anti-fuse device is broken down, an excessively high programming voltage will damage the selection transistor and affect the reliability of the selection transistor. In order to improve the reliability, the selection transistor in the anti-fuse unit uses a thicker gate oxide layer than the anti-fuse device, which will cause the production process to become complicated.

In order to facilitate the understanding of the disclosure, the disclosure will be described more fully below with reference to relevant drawings. The drawings show preferred embodiments of the disclosure. However, the disclosure can be implemented in many different forms and is not limited to the embodiments described herein. On the contrary, the purpose of providing these embodiments is to make the understanding of the content of the disclosure more thorough and comprehensive.

Unless otherwise defined, all technical and scientific terms used herein have the same meanings as commonly understood by those skilled in the art of the disclosure. The terms used in the specification of the disclosure herein are only for the purpose of describing specific embodiments, but are not intended to limit the disclosure. The term "and/or" as used herein includes any and all combinations of one or more of the related listed items.

In the description of the disclosure, it should be understood that the orientation or position relationships indicated by terms "upper", "lower", "vertical", "horizontal", "inside", "outside" and the like are based on orientation or position relationships shown in drawings. These terms are only for the convenience of describing the disclosure and simplifying the description, and do not indicate or imply that the specified device or component must have a specific orientation and must be constructed and operated in the specific orientation, so that it can not be understood as a limitation to the disclosure.

Figure 1:
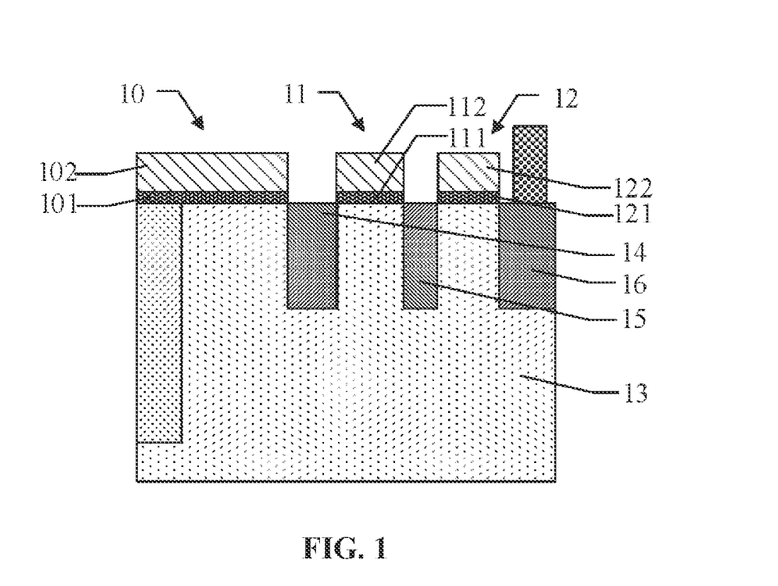
FIG. 1 shows a schematic view of an anti-fuse device according to an embodiment of the disclosure.

As shown in FIG. 1, the disclosure provides an anti-fuse unit, including an anti-fuse device 10, a first selection transistor 11 and a second selection transistor 12. The first selection transistor 11 is electrically connected with the anti-fuse device 10, and the second selection transistor 12 is electrically connected with the first selection transistor 11. The anti-fuse device 10, the first selection transistor 11 and the second selection transistor 12 have respective gate oxide layers with the same thickness and respective gate conductive layers with the same thickness. That is, a gate oxide layer 101 of the anti-fuse device 10, a gate oxide layer 111 of the first selection transistor 11 and a gate oxide layer 121 of the second selection transistor 12 have the same thickness. A gate conductive layer 102 of the anti-fuse device 10, a gate conductive layer 112 of the first selection transistor 11 and a gate conductive layer 122 of the second selection transistor 12 have the same thickness.

Through the above technical solution, the anti-fuse device 10 is electrically connected with the first selection transistor 11, and the second selection transistor 12 is electrically connected with the first selection transistor 11. During an anti-fuse test, the first selection transistor 11 and the second selection transistor 12 can divide the voltage, so that the gate oxide layer 111 of the first selection transistor 11 and the gate oxide layer 121 of the second selection transistor 12 can be made thinner to obtain a thickness which is consistent with the thickness of the gate oxide layer 101 of the anti-fuse device 10. Since the gate oxide layer 101 of the anti-fuse device 10, the gate oxide layer 111 of the first selection transistor 11 and the gate oxide layer 121 of the second selection transistor 12 have the same thickness, the three gate oxide layers can be generated simultaneously in the same step. In the same way, the gate conductive layer 102 of the anti-fuse device 10, the gate conductive layer 112 of the first selection transistor 11 and the gate conductive layer 122 of the second selection transistor 12 can also be generated in the same process, thereby avoiding the process complexity caused by different thicknesses of the gate oxide layer 101, the gate oxide layer 111 and the gate oxide layer 121, simplifying the process steps while meeting the requirement for the anti-fuse unit to withstand a higher breakdown voltage, and improving the production efficiency.

In an optional embodiment, the anti-fuse device 10 is further provided with a substrate 13. The substrate 13 may be a semiconductor substrate, such as a monocrystalline silicon substrate and a monocrystalline germanium substrate, and the substrate 13 may have a P-type well region inside the substrate 13. The anti-fuse device 10 includes a first heavily doped region 14, a gate oxide layer 101 and a gate conductive layer 102. The gate oxide layer 101 is located on an upper surface of the substrate 13 on a side of the first heavily doped region 14 away from the first selection transistor 11, and the gate conductive layer 102 is located on an upper surface of the gate oxide layer 101. The first selection transistor 11 includes a gate oxide layer 111, a gate conductive layer 112, a source electrode and a drain electrode. The gate oxide layer 111 is located on the upper surface of the substrate 13 and located on a side of the first heavily doped region 14 away from the gate oxide layer 101, and the gate conductive layer 112 is located on an upper surface of the gate oxide layer 111. The second selection transistor 12 includes a gate oxide layer 121, a gate conductive layer 122, a second heavily doped region 15 and a third heavily doped region 16. The gate oxide layer 121 is located on the upper surface of the substrate 13 and located on a side of the gate oxide layer 111 away from the gate oxide layer 101, and there is a distance between the gate oxide layer 121 and the gate oxide layer 111. The gate conductive layer 122 is located on an upper surface of the gate oxide layer 121, the second heavily doped region 15 is located between the gate oxide layer 121 and the gate oxide layer 111, and the third heavily doped region 16 is located on a side of the gate oxide layer 121 away from the second heavily doped region 15. The first heavily doped region 14, the second heavily doped region 15 and the third heavily doped region 16 are formed inside the substrate 13. The first heavily doped region 14 is a source electrode or drain electrode shared by the anti-fuse device 10 and the first selection transistor 11, the second heavily doped region 15 is a drain electrode or source electrode shared by the first selection transistor 11 and the second selection transistor 12, and the third heavily doped region 16 is a source electrode or drain electrode of the second selection transistor 12.

In an optional embodiment, the first heavily doped region 14 is a source electrode shared by the anti-fuse device 10 and the first selection transistor 11, the second heavily doped region 15 is a drain electrode shared by the first selection transistor 11 and the second selection transistor 12, and the third heavily doped region 16 is a source electrode of the second selection transistor 12.

In another optional embodiment, the first heavily doped region 14 is a drain electrode shared by the anti-fuse device 10 and the first selection transistor 11, the second heavily doped region 15 is a source electrode shared by the first selection transistor 11 and the second selection transistor 12, and the third heavily doped region 16 is a drain electrode of the second selection transistor 12.

In an optional embodiment, the first heavily doped region 14, the second heavily doped region 15 and the third heavily doped region 16 may be formed by means of ion injection in the substrate 13, may have the same doping concentration, and may be N-type heavily doped or P-type heavily doped.

Figure 3:
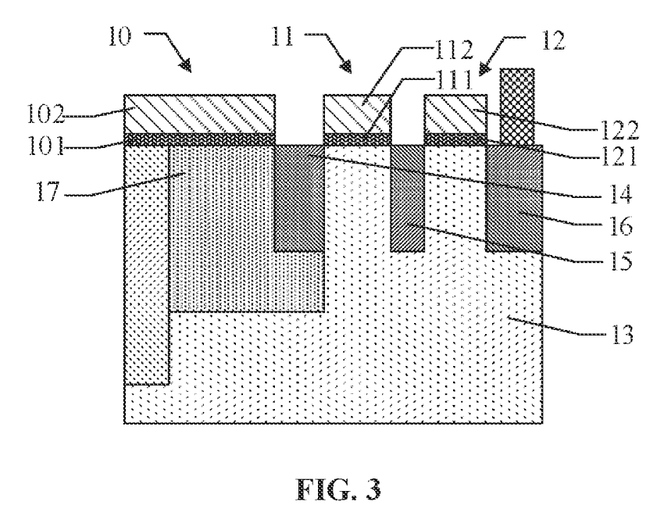
FIG. 3 is a schematic cross-sectional view along a direction AA in FIG. 2.

As shown in FIG. 3, in an optional embodiment, the anti-fuse device 10 further includes an anti-fuse injection region 17, the anti-fuse injection region 17 is located below the gate oxide layer 101 of the anti-fuse device 10, and the anti-fuse injection region 17 surrounds the first heavily doped region 14. The anti-fuse injection region 17 makes the breakdown of the gate oxide layer 101 of the anti-fuse device 10 easier, and the breakdown voltage of the gate oxide layer 101 of the anti-fuse device 10 can be adjusted according to the doping concentration of the anti-fuse injection region 17, so that the flexibility of manufacturing the anti-fuse device 10 is higher. The doping type of the anti-fuse injection region 17 is the same as the doping type of the first heavily doped region 14, which may be N-type doping. The anti-fuse injection region 17 is formed by means of ion injection, and the ion doping concentration of the anti-fuse injection region 17 is lower than the ion doping concentration of the first heavily doped region 14.

Figure 2:
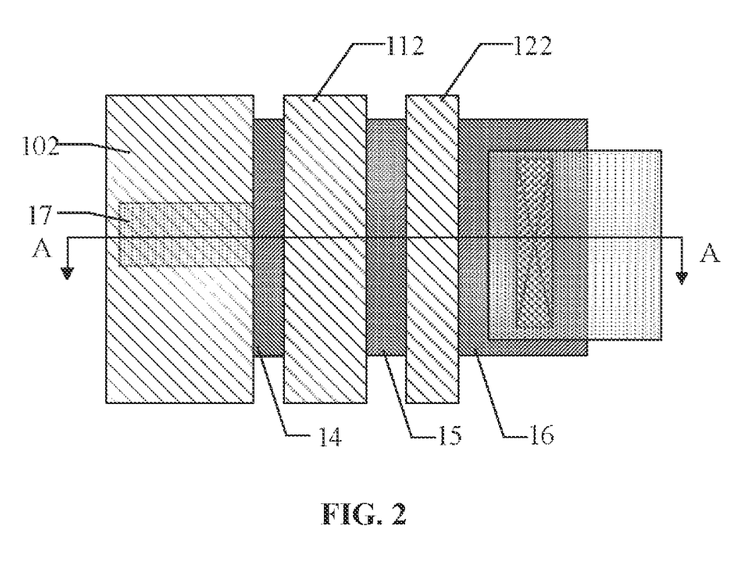
FIG. 2 shows a schematic top view of an anti-fuse device according to an embodiment of the disclosure.

As shown in FIG. 2, the effective width of the anti-fuse device 10 is the width of the overlapping region of the gate conductive layer 102 and the anti-fuse injection region 17, namely the width of the overlapping region of the gate conductive layer 102 and the anti-fuse injection region 17 along a direction perpendicular to the direction AA in FIG. 2, namely the width of the overlapping region of the gate conductive layer 102 and the anti-fuse injection region 17 along a direction perpendicular to the arrangement direction of the gate conductive layer 102, the gate conductive layer 112 and the gate conductive layer 122 in the figure. The effective width of the first selection transistor 11 is the width of the heavily doped regions on both sides of the gate conductive layer 112, that is, the effective width of the first selection transistor 11 is the width of the first heavily doped region 14 (namely the width of the first heavily doped region 14 along a direction perpendicular to the direction AA in FIG. 2). The effective width of the second selection transistor 12 is the width of the heavily doped regions on both sides of the gate conductive layer 122, that is, the effective width of the second selection transistor 12 is the width of the second heavily doped region 15 (namely the width of the second heavily doped region 15 along a direction perpendicular to the direction AA in FIG. 2). It can be seen from FIG. 2 that the effective width of the first selection transistor 11 is the same as the effective width of the second selection transistor 12. Each of the ratio of the effective width of the anti-fuse device 10 to the effective width of the first selection transistor 11 and the ratio of the effective width of the anti-fuse device 10 to the effective width of the second selection transistor 12 ranges from 1:1 to 1:20, such as 1:1, 1:2 or 1:10, but the above data is only an example. In actual embodiments, the ratio of the effective width of the anti-fuse device 10 to the effective width of the first selection transistor 11 and the ratio of the effective width of the anti-fuse device 10 to the effective width of the second selection transistor 12 are not limited to the above data.

Figure 4:
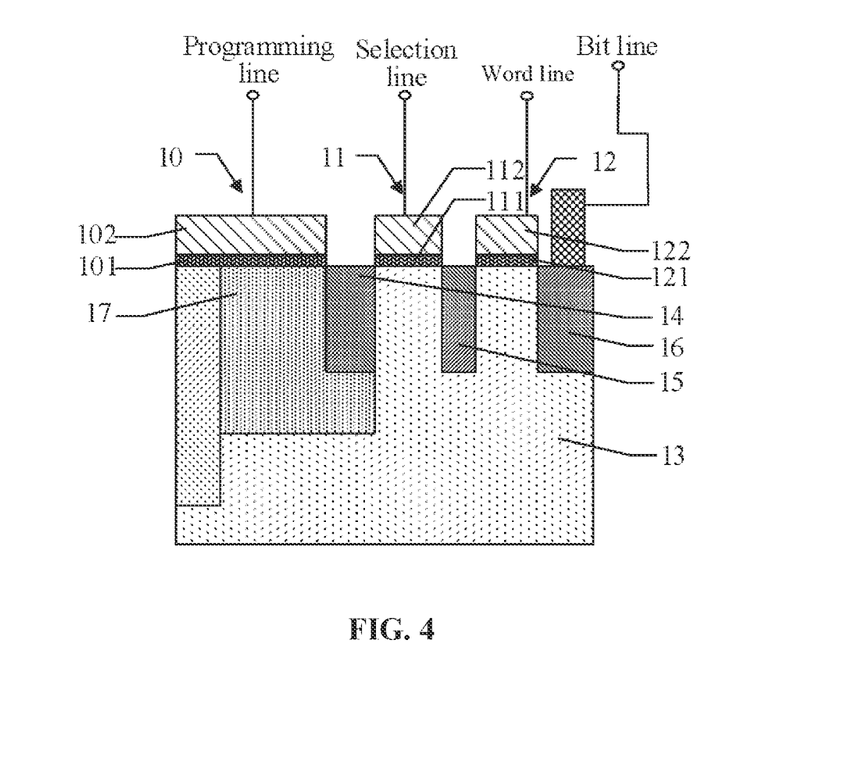
FIG. 4 is a schematic view showing a programming line, a word line, a bit line and a selection line according to an embodiment of the disclosure.

As shown in FIG. 4, in an optional embodiment, the anti-fuse unit further includes a programming line, a word line, a bit line and a selection line. The programming line is electrically connected with the gate electrode of the anti-fuse device 10 (specifically, the programming line is electrically connected with the gate conductive layer 102), the selection line is electrically connected with the gate electrode of the first selection transistor 11 (specifically, the selection line is electrically connected with the gate conductive layer 112), the word line is electrically connected with the gate electrode of the second selection transistor 12 (specifically, the word line is electrically connected with the gate conductive layer 122), and the bit line is electrically connected with the third heavily doped region 16 through a conductive plug (not shown).

During a write operation, the programming line is connected to a high voltage VPP, and the word line is connected to a fixed voltage VDD. The high voltage VPP is comprised between 3 V and 6 V, such as 3 V, 4 V or 6 V, and the fixed voltage VDD is comprised between 0.5 V and 2.5 V, such as 0.5 V, 1 V or 2.5 V, but the above data is only an example. In actual embodiments, the specific values of the VPP and VDD are not limited to the above data. The write operation includes a write "1" operation and a write "0" operation. During the write "0" operation, the bit line is connected to a zero voltage. During the write "1" operation, the value of the voltage connected to the bit line is equal to the value of the fixed voltage VDD connected to the word line. In an optional embodiment, during a write operation, the selection line is connected to a medium voltage, and the medium voltage is less than the programming voltage VPP during the write operation and greater than the fixed voltage VDD connected to the word line during the write operation. When the selection line is connected to the medium voltage, it is equivalent to adding a resistor between the anti-fuse device 10 and the second selection transistor 12, thereby reducing the conduction resistance of a conduction circuit through which the breakdown current passes.

During a read operation, the programming line is connected to a low voltage Vread, the word line is still connected to the fixed voltage VDD, the selection line is connected to the fixed voltage VDD, and the bit line is connected to a zero voltage. The low voltage Vread is comprised between 0.5 V and 2.5 V, such as 0.5 V, 1 V or 2.5 V, and the fixed voltage VDD is comprised between 0.5 V and 2.5 V, such as 0.5 V, 1 V or 2.5 V, but the above data is only an example. In actual embodiments, the specific values of the VPP and VDD are not limited to the above data.

Figure 5:
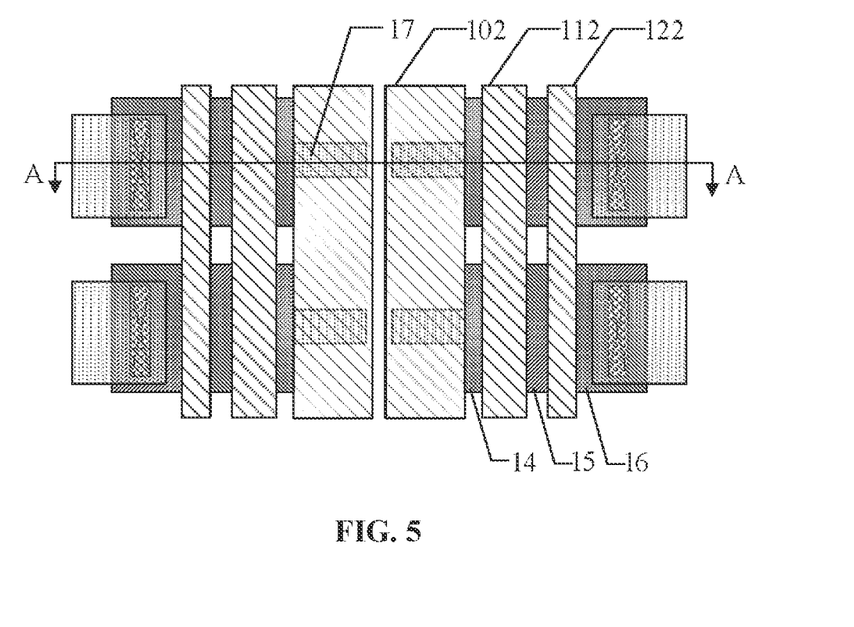
FIG. 5 is a schematic top view of an anti-fuse array according to an embodiment of the disclosure.
Figure 6:
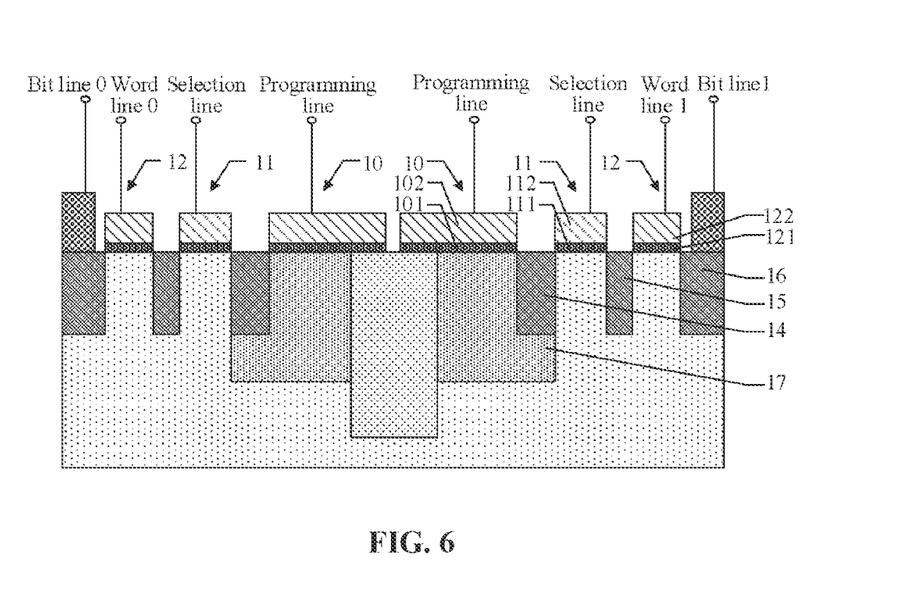
FIG. 6 is a schematic cross-sectional view along a direction AA in FIG. 5.

The disclosure further provides an anti-fuse array. As shown in FIG. 5 and FIG. 6, the anti-fuse array includes a plurality of anti-fuse units in any one of the above embodiments. The plurality of anti-fuse units may be arranged in M rows and N columns, and the M and N are positive even numbers. In FIG. 5 and FIG. 6, in an example, the anti-fuse array includes four anti-fuse units and the four anti-fuse units are arranged in two rows and two columns. In practical examples, the number and arrangement mode of the anti-fuse units in the anti-fuse array are not limited thereto. Adjacent anti-fuse units may be isolated from each other through the shallow trench isolation structures (not shown) located in the substrate 13.

In an optional embodiment, the respective programming lines of the anti-fuse units arranged in M rows and N columns are connected to the same voltage source, and the respective selection lines of the anti-fuse units arranged in M rows and N columns are connected to the same voltage source.

When it is necessary to perform a write operation on the anti-fuse unit in the x-th row and the y-th column (wherein x is a positive integer less than or equal to M, and y is a positive integer less than or equal to N), the programming line of the anti-fuse unit in the x-th row and the y-th column is connected to the high voltage VPP, and the word line of said anti-fuse unit is connected to the fixed voltage VDD. The high voltage VPP is comprised between 3 V and 6 V, such as 3 V, 4 V or 6 V, and the fixed voltage VDD is comprised between 0.5 V and 2.5 V, such as 0.5 V, 1 V or 2.5 V. However, in specific examples, the specific values of the VPP and VDD are not limited to the above data. During the write "1" operation, the bit line of said anti-fuse unit is connected to a voltage of which the value is equal to the value of the fixed voltage VDD connected to the word line. During the write "0" operation, the bit line of said anti-fuse unit is connected to a zero voltage. During the write operation, the selection line may be connected to a medium voltage all the time, and the medium voltage is less than the programming voltage VPP during the write operation and greater than the fixed voltage VDD connected to the word line during the write operation.

When it is necessary to perform a read operation on the anti-fuse unit in the x-th row and the y-th column, the programming line of the anti-fuse unit in the x-th row and the y-th column is connected to the low voltage Vread, the word line of said anti-fuse unit is connected to the fixed voltage VDD, the selection line of said anti-fuse unit is also connected to the fixed voltage VDD, and the bit line of said anti-fuse unit is connected to a zero voltage. The low voltage Vread is comprised between 0.5 V and 2.5 V. such as 0.5 V, 1 V or 2.5 V. and the fixed voltage VDD is comprised between 0.5 V and 2.5 V, such as 0.5 V, 1 V or 2.5 V.

In conclusion, the gate oxide layer 111 of the first selection transistor 11, the gate oxide layer 121 of the second selection transistor 12 and the gate oxide layer 101 of the anti-fuse device 10 have the same thickness, and the gate conductive layer 112 of the first selection transistor 11, the gate conductive layer 122 of the second selection transistor 12 and the gate conductive layer 102 of the anti-fuse device 10 have the same thickness. The gate oxide layer 101, gate oxide layer 111 and the gate oxide layer 121 may be simultaneously generated in the same step, and in the same way, the gate conductive layer 102, the gate conductive layer 112 and the gate conductive layer 122 may also be generated in the same process, thereby avoiding the process complexity caused by different thicknesses of the gate oxide layer 101, the gate oxide layer 111 and the gate oxide layer 121, simplifying the process steps while meeting the requirement for the anti-fuse unit to withstand a higher breakdown voltage, and improving the production efficiency.

Various technical features in the foregoing embodiments may be randomly combined. For ease of simple description, not all possible combinations of various technical features in the foregoing embodiments are described. However, as long as the combinations of these technical features do not contradict, they should be regarded as falling within the scope of the present specification.

The foregoing embodiments merely describe several implementation manners of the disclosure particularly in more detail, but cannot be thus understood as limitations to the patent scope of the disclosure. It should be noted that a person of ordinary skill in the art may further make several variations and improvements without departing from the conception of the disclosure, and all these fall within the protection scope of the disclosure. Therefore, the patent protection scope of the disclosure should be subject to the appended claims.

The invention claimed is:

1. An anti-fuse circuit, comprising:
an anti-fuse device;
a first selection transistor electrically connected with the anti-fuse device; and
a second selection transistor electrically connected with the first selection transistor,
wherein each of the anti-fuse device, the first selection transistor and the second selection transistor is provided with a gate oxide layer and a gate conductive layer, the gate oxide layer of the anti-fuse device, the gate oxide layer of the first selection transistor and the gate oxide layer of the second selection transistor have a same thickness, and the gate conductive layer of the anti-fuse device, the gate conductive layer of the first selection transistor and the gate conductive layer of the second selection transistor have a same thickness,
the anti-fuse device comprises a first heavily doped region, and the first heavily doped region is a source electrode or drain electrode shared by the anti-fuse device and the first selection transistor, and
the second selection transistor comprises a second heavily doped region and a third heavily doped region, the second heavily doped region is a drain electrode or source electrode shared by the first selection transistor and the second selection transistor, and the third heavily doped region is a source electrode or drain electrode of the second selection transistor.

2. The anti-fuse circuit of claim 1, wherein the first heavily doped region is the source electrode shared by the anti-fuse device and the first selection transistor, the second heavily doped region is the drain electrode shared by the first selection transistor and the second selection transistor, and the third heavily doped region is the source electrode of the second selection transistor.

3. The anti-fuse circuit of claim 1, wherein the first heavily doped region is the drain electrode shared by the anti-fuse device and the first selection transistor, the second heavily doped region is the source electrode shared by the first selection transistor and the second selection transistor, and the third heavily doped region is the drain electrode of the second selection transistor.

4. The anti-fuse circuit of claim 1, wherein the first heavily doped region, the second heavily doped region and the third heavily doped region are formed by means of ion injection in a substrate, have a same doping concentration, and are N-type heavily doped or P-type heavily doped.

5. The anti-fuse circuit of claim 1, further comprising a programming line, a word line, a bit line and a selection line, wherein the programming line is electrically connected with a gate electrode of the anti-fuse device, the selection line is electrically connected with a gate electrode of the first selection transistor, the word line is electrically connected with a gate electrode of the second selection transistor, and the bit line is electrically connected with the third heavily doped region.

6. The anti-fuse circuit of claim 5, wherein the anti-fuse device is provided with an anti-fuse injection region, the anti-fuse injection region is located below the gate oxide layer of the anti-fuse device, and the anti-fuse injection region surrounds the first heavily doped region.

7. The anti-fuse circuit of claim 6, wherein a doping concentration of the anti-fuse injection region is less than or equal to a doping concentration of the first heavily doped region.

8. The anti-fuse circuit of claim 5, wherein the first heavily doped region, the second heavily doped region and the third heavily doped region have a same doping concentration.

9. The anti-fuse circuit of claim 5, wherein the programming line is connected to a high voltage during a write operation, the high voltage is between 3 V and 6 V, the programming line is connected to a low voltage during a read operation, and the low voltage is between 0.5 V and 2.5 V.

10. The anti-fuse circuit of claim 5, wherein the word line is connected to a fixed voltage during each of a write operation and a read operation, and the fixed voltage is between 0.5 V and 2.5 V.

11. The anti-fuse circuit of claim 5, wherein the bit line is connected to a zero voltage during a write "0" operation, a value of a voltage connected to the bit line during a write "1" operation is equal to a value of a voltage connected to the word line, and the bit line is connected the zero voltage during a read operation.

12. The anti-fuse circuit of claim 5, wherein the selection line is connected to a medium voltage during a write operation, a value of the medium voltage is less than a value of a voltage of the programming line during the write operation and greater than a value of a voltage connected to the word line during the write operation, and a value of a voltage connected to the selection line during a read operation is equal to the value of the voltage connected to the word line.

13. The anti-fuse circuit of claim 1, wherein a ratio of an effective width of the anti-fuse device to an effective width of the first selection transistor ranges from 1:1 to 1:20, and a ratio of the effective width of the anti-fuse device to an effective width of the second selection transistor ranges from 1:1 to 1:20.

14. An anti-fuse array, comprising a plurality of anti-fuse circuits, wherein each anti-fuse circuit of the plurality of anti-fuse circuits comprises an anti-fuse device; a first selection transistor electrically connected with the anti-fuse device; and a second selection transistor electrically connected with the first selection transistor, wherein in each anti-fuse circuit of the plurality of anti-fuse circuits, each of the anti-fuse device, the first selection transistor and the second selection transistor is provided with a gate oxide layer and a gate conductive layer, the gate oxide layer of the anti-fuse device, the gate oxide layer of the first selection transistor and the gate oxide layer of the second selection transistor have a same thickness, and the gate conductive layer of the anti-fuse device, the gate conductive layer of the first selection transistor and the gate conductive layer of the second selection transistor have a same thickness, the anti-fuse device comprises a first heavily doped region, the first heavily doped region is a source electrode or drain electrode shared by the anti-fuse device and the first selection transistor, the second selection transistor comprises a second heavily doped region and a third heavily doped region, the second heavily doped region is a drain electrode or source electrode shared by the first selection transistor and the second selection transistor, and the third heavily doped region is a source electrode or drain electrode of the second selection transistor, the plurality of anti-fuse circuits are arranged in M rows and N columns, and the M and the N are positive even numbers.

15. The anti-fuse array of claim 14, wherein respective programming lines of the plurality of anti-fuse circuits arranged in the M rows and the N columns are connected to a same voltage source, and respective selection lines of the plurality of anti-fuse circuits arranged in the M rows and the N columns are connected to a same voltage source.

* * * * *